US006709908B2

(12) United States Patent
Sato et al.

(10) Patent No.: US 6,709,908 B2
(45) Date of Patent: Mar. 23, 2004

(54) METHODS FOR MAKING SEMICONDUCTOR DEVICES

(75) Inventors: Yoko Sato, Suwa (JP); Akihiko Ebina, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/791,984

(22) Filed: Feb. 23, 2001

(65) Prior Publication Data

US 2002/0045326 A1 Apr. 18, 2002

(30) Foreign Application Priority Data

Feb. 23, 2000 (JP) ........................................ 2000-046389

(51) Int. Cl.[7] .............................................. H01L 21/84
(52) U.S. Cl. ...................... 438/165; 438/295; 438/404; 438/405; 438/517; 438/525
(58) Field of Search .................................. 438/165, 295, 438/404, 405, 517, 525, FOR 169, FOR 171, FOR 222

(56) References Cited

U.S. PATENT DOCUMENTS

| 5,780,352 A | * | 7/1998 | Park et al. .................. 438/404 |
| 5,801,081 A | * | 9/1998 | Warashina et al. .......... 438/404 |
| 6,284,615 B1 | * | 9/2001 | Pinto et al. .................. 438/336 |
| 2002/0037626 A1 | * | 3/2002 | Muth .......................... 438/404 |

FOREIGN PATENT DOCUMENTS

| JP | 06-204334 | 7/1994 | .......... H01L/21/76 |
| JP | 11-074538 | 3/1997 | .......... H01L/29/786 |
| JP | 09-252132 | 9/1997 | .......... H01L/29/78 |

* cited by examiner

*Primary Examiner*—George Fourson
*Assistant Examiner*—Michelle Estrada
(74) *Attorney, Agent, or Firm*—Konrad Raynes Victor & Mann, LLP; Alan S. Raynes

(57) ABSTRACT

Certain embodiments relate to methods for making a semiconductor device that inhibit the formation of a parasitic device. A method for making a semiconductor device includes a delimiting step and a dopant implantation step. The delimiting step partially oxidizes a single-crystal silicon layer provided on a semiconductor substrate 11 with an insulating layer therebetween to form a plurality of isolated single-crystal-silicon-layer segments 13a delimited by the insulating layer 16. In the implantation step, dopant ions 18 are implanted into the single-crystal-silicon-layer segments 13a to activate the single-crystal-silicon-layer segments 13a. In this implantation step, the dopant is implanted into the single-crystal-silicon-layer segments 13a by an implantation energy which is set so that the position of the maximum of the dopant concentration lies at bottom edges Ea and Eb of each single-crystal-silicon-layer segment 13a.

4 Claims, 9 Drawing Sheets

METHODS FOR MAKING SEMICONDUCTOR DEVICES

Japanese Patent Application No. 2000-046389, filed Feb. 23, 2000, is hereby incorporated by reference in its entirety.

1. Technical Field

The present invention relates to methods for making semiconductor devices, and particularly to methods for making semiconductor devices including those having a silicon-on-insulator (SOI) structure.

2. Related Art

In general, in a known semiconductor device having a silicon-on-insulator (SOI) structure, a delimited region is formed into a single-crystal silicon layer which is provided over a semiconductor substrate with an insulating layer therebetween to delimit the single-crystal silicon layer into a plurality of segments, and the delimited single-crystal silicon layer segments are activated to provide semiconductor integrated-circuit elements. Such a semiconductor device has been produced by various methods.

FIG. 4 includes process drawings showing an embodiment of a conventional method for making an SOI-structured semiconductor device. The semiconductor device is enlarged in the drawing.

This conventional method for making the semiconductor device includes a delimiting step 110 for delimiting a silicon layer provided over a semiconductor substrate with an insulating layer therebetween, and an implantation step 120 for implanting a dopant into the delimited silicon-layer segments to activate the delimited silicon-layer segments.

In more detail, this delimiting step 110, as shown in FIG. 4(a), prepares an SOI substrate 100 in which a single-crystal silicon layer (silicon layer) 113 is provided over a single-crystal silicon substrate 111 with an insulating layer 112 composed of silicon dioxide ($SiO_2$) therebetween. Next, a protective film 114 composed of silicon nitride ($Si_3N_4$) is provided on a position corresponding to each active region of the single-crystal silicon layer 113 (see FIG. 4(b)). The SOI substrate 100 provided with the protective film 114 is heated in an oxidizing atmosphere to partially oxidize the single-crystal silicon layer 113 to convert the single-crystal silicon layer 113 into a plurality of isolated single-crystal silicon-layers 113a which are delimited by an insulating layer 115 as a delimited region, and then the protective film 114 is removed (FIG. 4(c)). Hereinafter, the insulating layer 115 and the insulating layer 112 are collectively referred to as an insulating layer 116.

The implantation step 120 will now be described. In this implantation step 120, as shown in FIG. 4(d), a region of the SOI substrate 100 in which the dopant will not be implanted is covered and a resist 117 is formed by a photolithographic process. For example, when n-channel MOS transistors (nMOSs) are formed in the single-crystal-silicon-layer segments 113a shown in FIG. 4, portions for forming p-channel MOS transistors (pMOSs) are covered and the resist 117 is provided. When, for example, nMOSs are formed in the single-crystal-silicon-layer segments 113a shown in FIG. 4, the entire surface of the SOI substrate 100 is irradiated with dopant ions 119, for example, boron (B) or boron difluoride ($BF_2$) ions (see FIG. 4(d)) to implant dopant ions 119 into the single-crystal-silicon-layer segments 113a via a thin insulating layer (a sacrificial oxide layer) not shown in the drawing. The implantation of the dopant ions 119 is performed by an implantation energy which is set so that the position of the maximum of the implanted dopant concentration distribution lies within the region of each single-crystal-silicon-layer segment 113a. The single-crystal-silicon-layer segment 113a is thereby activated as a p-type semiconductor layer 118. As shown in FIG. 4(e), the resist 117 is removed.

Subsequent to the implantation step 120, a gate electrode, a source electrode, and a drain electrode are provided over the p-type semiconductor layer 118 with an insulating layer therebetween by a known process.

FIG. 5 is a plan view of an embodiment of a semiconductor circuit element having electrodes provided by the above known process. FIG. 6 is a cross-sectional view taken from line VI—VI in FIG. 5, and FIG. 7 is a cross-sectional view taken from line VII—VII in FIG. 5. Also in these drawings, the device is enlarged.

In these drawings, a gate electrode 132 is formed over the p-type semiconductor layer 118 of the SOI substrate 100 separated by an insulating layer (gate insulating film) 131. A source region and a drain region (both not shown in the drawing) doped with an n-type dopant such as phosphorus are formed at both sides of the gate electrode 132 of the p-type semiconductor layer 118, and a source electrode 133 and a drain electrode 134 beside the gate electrode 132 are provided on the source electrode and the drain electrode, respectively, to complete a semiconductor circuit element (nMOS) 130.

3. Problems With the Related Art

When the single-crystal silicon layer 113 is partially oxidized by the above-mentioned so-called local oxidation of silicon (LOCOS) to delimit the single-crystal silicon layer 113 into a plurality of single-crystal-silicon-layer segments 113a, oxidation propagates up to a portion under the protective film 114 to form a bird's beak and single-crystal silicon having a wedge shape remains under the bird's beak. When the single-crystal-silicon-layer segment 113a is doped with the dopant for activation, the dopant is implanted by an implantation energy which is set so that the maximum (peak) position of the dopant concentration distribution lies within the single-crystal-silicon-layer segment 113a covered with a thin insulating layer (for example, a sacrificial oxide film). Thus, as shown in FIG. 7, bottom edges Ea and Eb of the p-type semiconductor layer 118 are covered by the thick insulating layer 116 and the dopant concentrations in these edges are significantly lower than the dopant concentrations in other portions (for example, the center of the semiconductor layer 118) of the semiconductor layer 118. This phenomenon also occurs when the dopant is implanted without use of the sacrificial oxide film or the like.

Thus, a parasitic device is formed between these edges Ea and Eb and the gate electrode 132, and between these edges Ea and Eb and other electrodes 133 and 134. As a result of the formation of the parasitic device, as shown in FIG. 8, a semiconductor circuit element 150 is regarded as a serial connection of an original circuit element 151 and a circuit element 152 as the parasitic device. Thus, the characteristic curve of the drain current ($I_D$) verses the gate voltage ($V_G$), as shown in FIG. 9, corresponds to a combination of the characteristic curve J of the original semiconductor circuit element 151 and the characteristic curve K of the parasitic device, creating some problems such as leakage currents.

In order to solve such a problem, in conventional methods, ions are reimplanted into the edges Ea and Eb to increase the concentration of the dopant at the edges Ea and Eb. Accordingly, the number of the production steps and production costs are increased.

When no dopant is implanted, the shapes of the electrodes must be modified or connecting holes must be provided in the semiconductor layer so as to form no parasitic device. These countermeasures also cause an increase in the number of production steps.

SUMMARY

Embodiments include a method for making an SOI-structured semiconductor device. The method includes delimiting step for forming a delimited region in a silicon layer provided over a semiconductor substrate with an insulating layer therebetween to delimit the silicon layer into a plurality of delimited silicon-layer segments. The method also includes an implantation step for implanting a dopant into the delimited silicon-layer segments to activate the silicon layer. The implantation step includes implanting a dopant with an implantation energy which is set so that a maximum of the dopant concentration distribution lies at or adjacent to a peripheral portion of each of the delimited silicon-layer segments.

Embodiments also include a method for fabricating a semiconductor device having a silicon-on-insulator structure. The method includes forming a plurality of delimited silicon-layer segments having end portions in a silicon layer, and implanting a dopant into the delimited silicon-layer segments to activate the silicon layer, wherein the implanting is carried out so that a maximum dopant concentration lies in the end portions of each of the delimited silicon-layer segments.

BRIEF DESCRIPTION OF THE DRAWINGS

Embodiments of the invention are described with reference to the accompanying drawings which, for illustrative purposes, are schematic and not necessarily drawn to scale.

FIG. 1 shows a method for making a semiconductor device in accordance with a first embodiment of the present invention, where

DETAILED DESCRIPTION

Figure 1A:
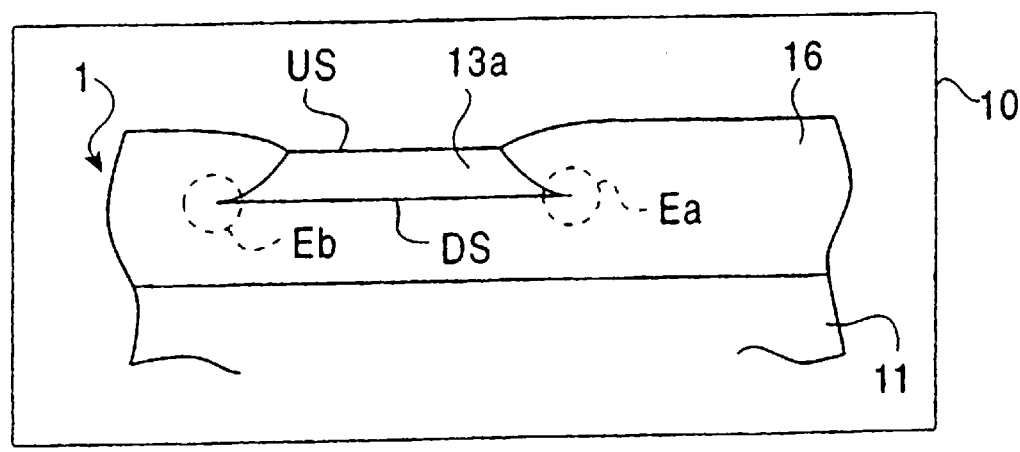
FIG. 1A illustrates a delimiting step and FIG. 1B illustrates an implantation step.

Certain embodiments of the present invention relate to methods for making a semiconductor device which solve the problems described above and thus inhibits the formation of a parasitic device.

It is another object of certain embodiments of the present invention to simplify the production steps.

One method for making an SOI-structured semiconductor device of the present invention comprises a delimiting step for forming a delimited region in a silicon layer provided on a semiconductor substrate with an insulating layer therebetween to delimit the silicon layer into a plurality of delimited silicon-layer segments, and an implantation step for implanting a dopant into the delimited silicon-layer segments to activate the silicon layer, wherein the implantation step is characterized in that the dopant is implanted with an implantation energy which is set so that the position of the maximum of the dopant concentration distribution lies at a peripheral portion or in the vicinity thereof of each delimited silicon-layer segment.

According to the method for making the semiconductor device described above, in the implantation step for activating the silicon layer segments, the dopant is implanted with an implantation energy which is set so that the position of the maximum of the dopant concentration distribution lies at a peripheral portion or in the vicinity thereof of each delimited silicon-layer segment; hence, the dopant concentration in the vicinity of the peripheral portion of the delimited silicon-layer segment is increased compared to the dopant concentrations in other portions of the silicon layer to prevent the formation of a parasitic device. That is, by only one dopant implantation step, the silicon layer can be activated and the dopant concentration of the silicon layer at the peripheral portion is increased relative to other portions, preventing the formation of the parasitic device, simplifying the production steps, and reducing production costs.

Although the implantation energy is preferably set so that the position of the maximum of the dopant concentration distribution lies at a position corresponding to the peripheral portion of the silicon layer, the position may be in the vicinity in the vertical direction of the peripheral portion. The direction of the dopant implantation, that is, the implantation direction of the dopant ions may be vertical or oblique to the silicon layer. When the dopant is obliquely implanted, the substrate is rotated. The rotated substrate preferably makes the dopant concentration uniform at each position in the peripheral portion or in the vicinity thereof of the silicon layer while the direction of the dopant ion beams is fixed.

A method for making the semiconductor device in accordance with an embodiment of the present invention will now be described with reference to FIGS. 1–3.

FIG. 1 shows a method for making the semiconductor device of a first embodiment of the present invention. FIG. 2 shows the relationship between the structure of the semiconductor layer in the implantation step of this method and the dopant concentrations at some positions in the semiconductor layer. In FIG. 2, the abscissa represents the dopant concentration and the ordinate represents the position (depth) in the SOI substrate. Also, in these drawings, each element is enlarged.

Figure 1B:
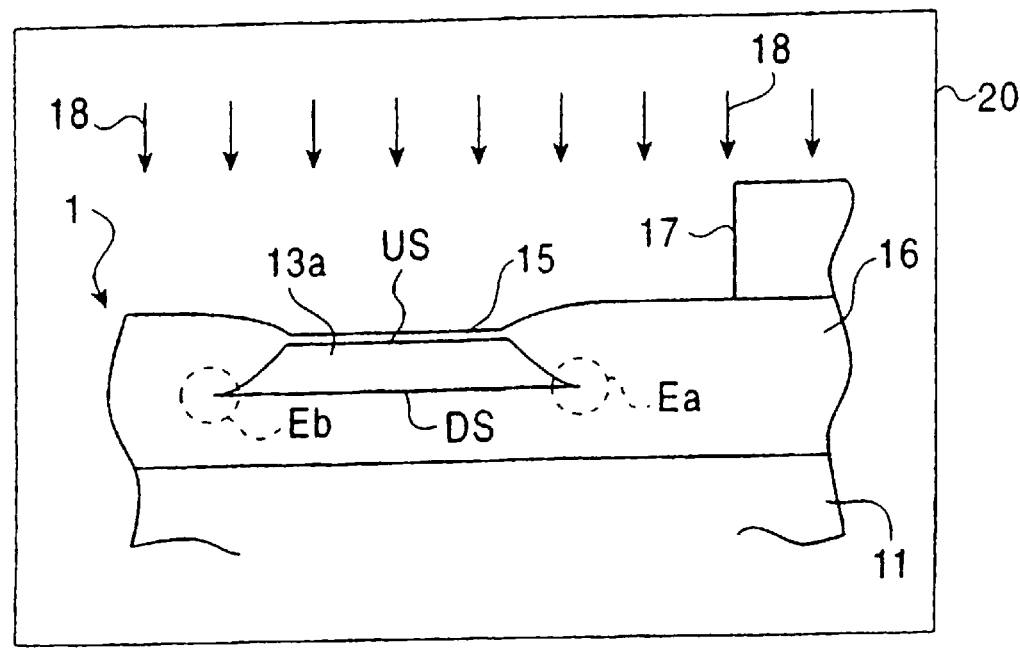

In FIG. 1, the method for making the semiconductor device in accordance with this embodiment of the present invention includes at least a delimiting step 10 (FIG. 1A) and an implantation step 20 (FIG. 1B).

Figure 4:
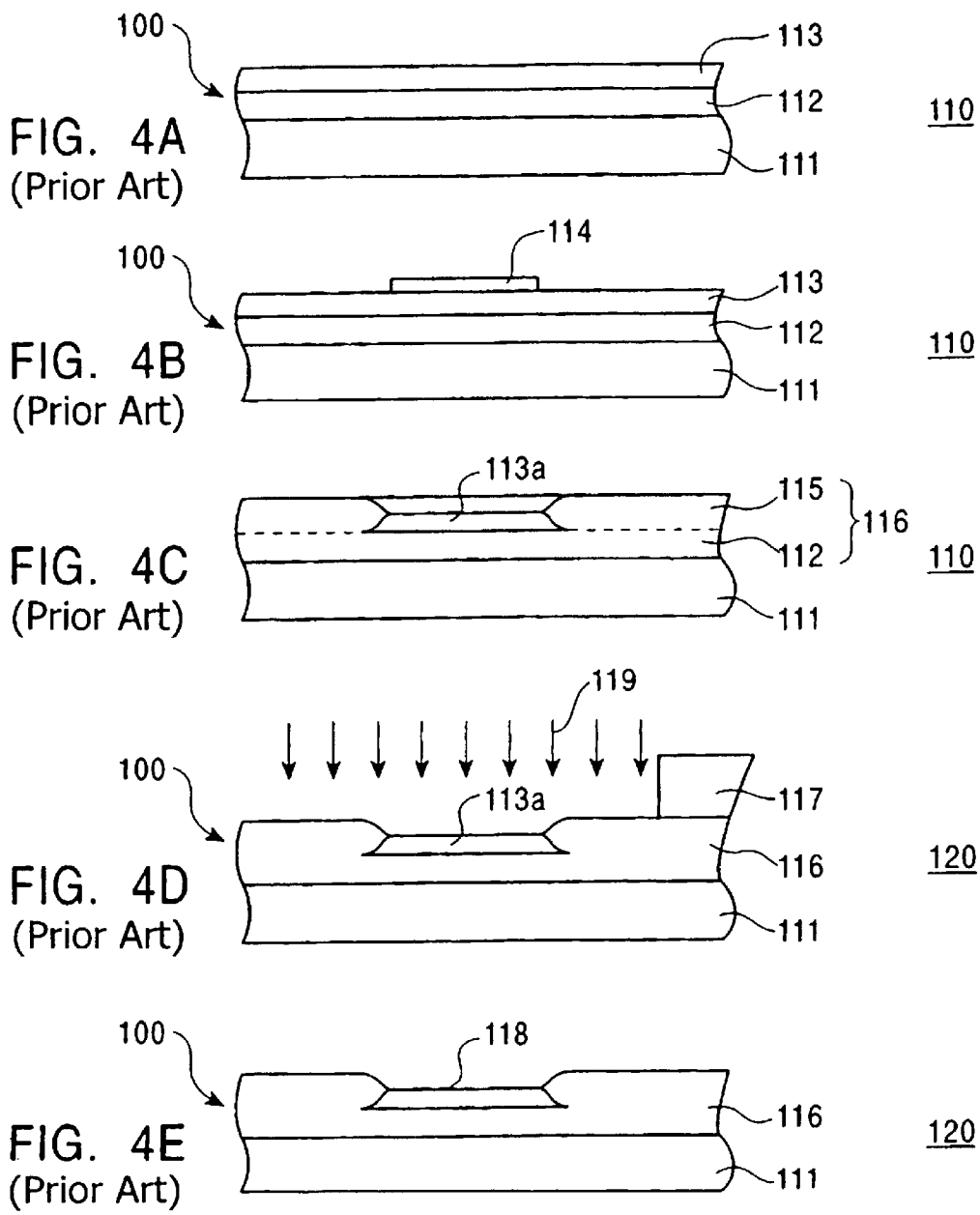
FIG. 4 shows steps of an embodiment of a method for making a conventional SOI-structured semiconductor device.
Figure 5:
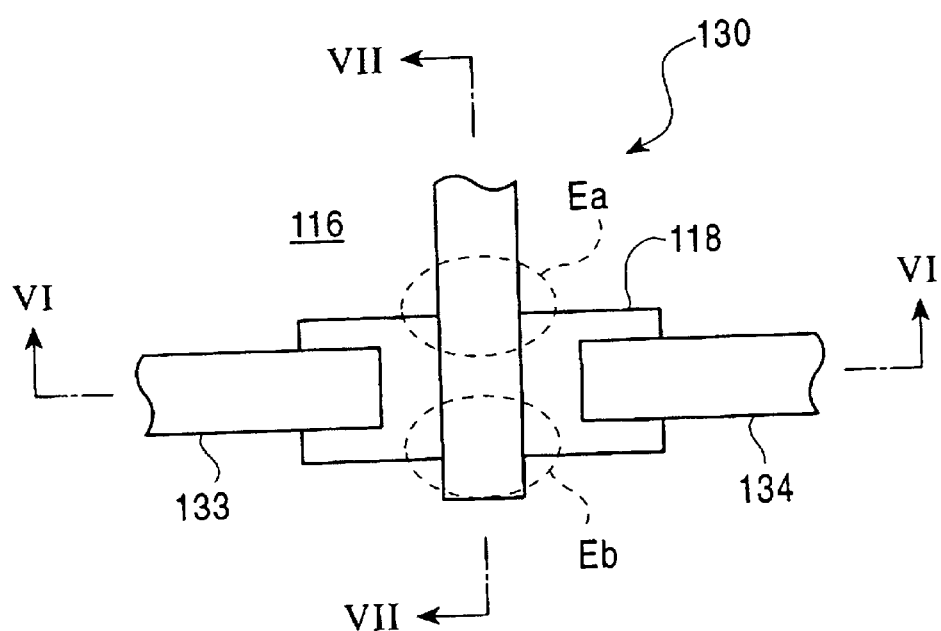
FIG. 5 is a plan view of an embodiment of an SOI-structured semiconductor circuit element provided with electrodes by a known method.
Figure 6:
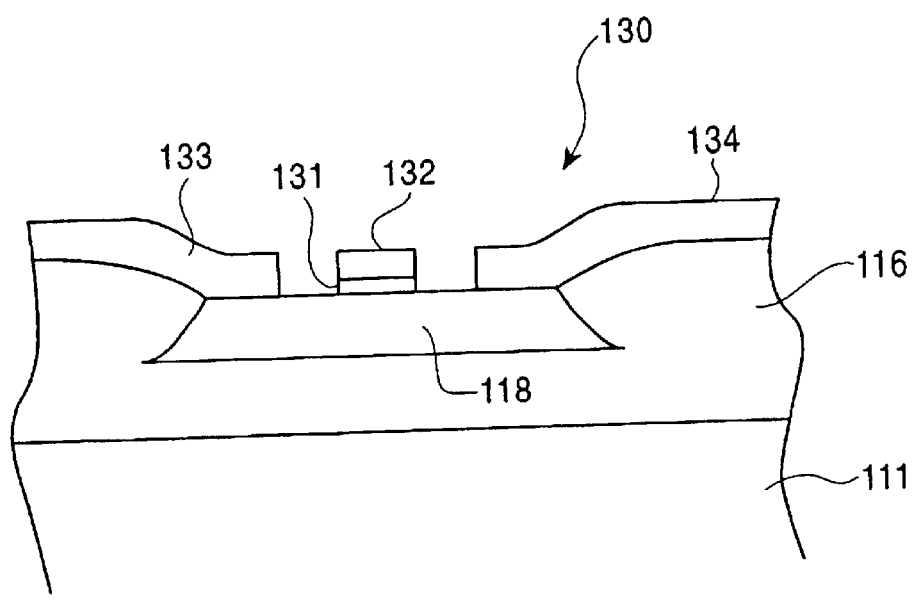
FIG. 6 is a cross-sectional view taken from line VI—VI in FIG. 4.
Figure 7:
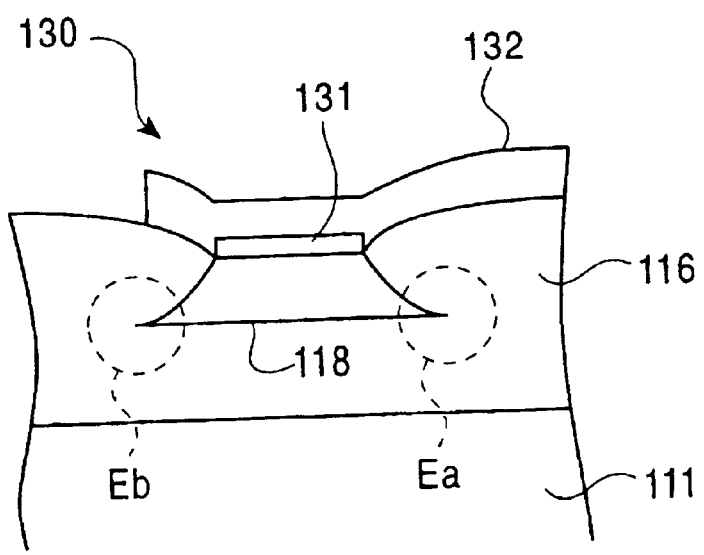
FIG. 7 is a cross-sectional view taken from line VII—VII in FIG. 4.
Figure 8:
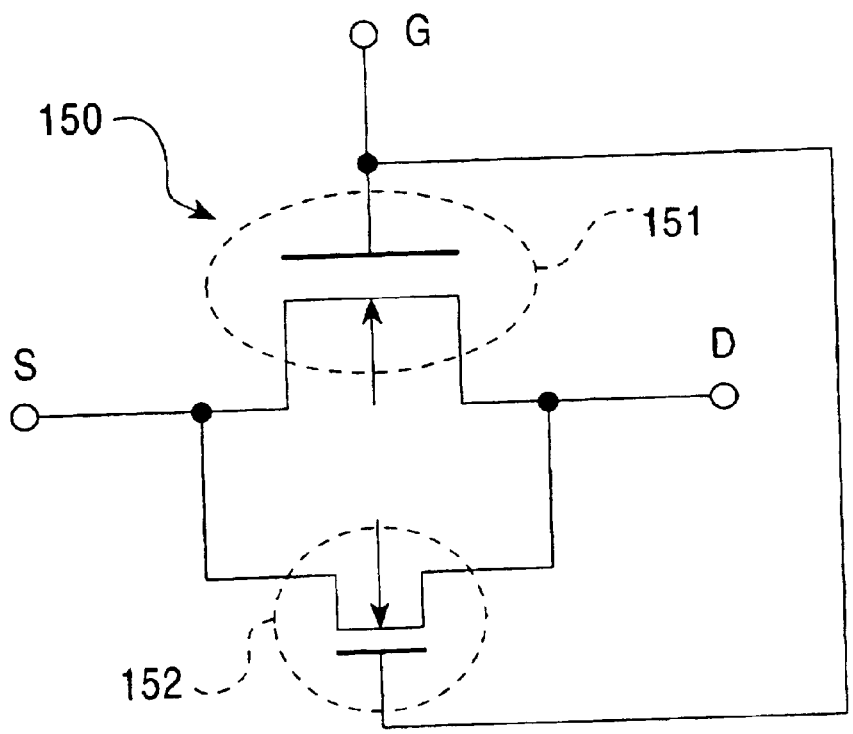
FIG. 8 is a circuit diagram showing a circuit configuration of an original semiconductor circuit element and a parasitic device.
Figure 9:
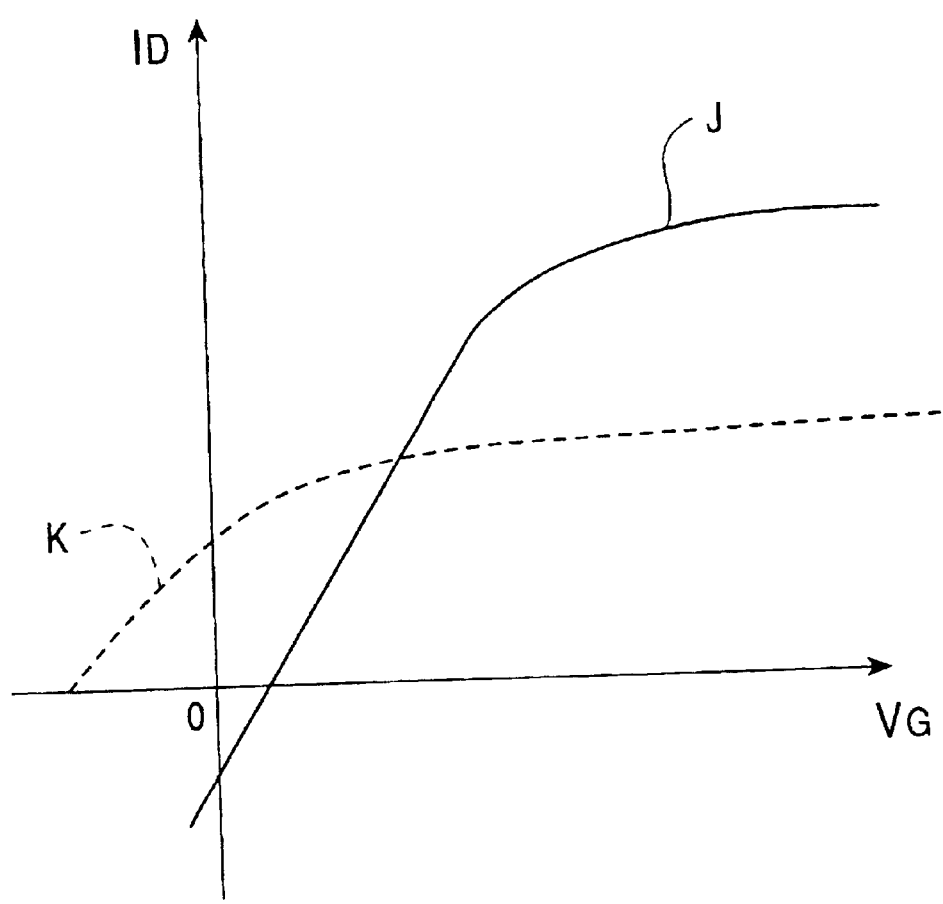
FIG. 9 is a graph showing a drain current versus gate voltage characteristic of the above original semiconductor circuit element and a drain current versus gate voltage characteristic due to the formation of the parasitic device.

This delimiting step 10 is identical to conventional production steps, for example, a delimiting step 110 shown in FIG. 4, in which an insulating layer 16 is formed on a semiconductor substrate 11 constituting an SOI substrate 1, and the single-crystal silicon layer is delimited by the insulating layer 16 as a delimiting region into a plurality of silicon layer segments 13a. In the single-crystal-silicon-layer segments 13a of the SOI substrate 1, as shown in FIGS. 1 and 2, the bottom face DS is wider than the top face US so that the wedged bottom edges (peripheral portions) Ea and Eb of the bottom face DS encroach on the insulating layer 16.

Next, the implantation step 20 will be described. A sacrificial oxide film 15 for protection is formed by thermal oxidation or the like on the upper surface of each single-crystal-silicon-layer segment 13a in the SOI substrate 1. The sacrificial oxide film 15 is not always an essential component, and some devices may not have the sacrificial oxide film 15. A resist 17 is provided by a photolithographic process on a region in which a dopant will not be implanted. For example, an nMOS is formed in a single-crystal-silicon-layer segment 13a shown in FIG. 1, the region for forming the pMOS is covered with the resist 17. Over the surface of the SOI substrate 1, p-type dopant ions 18, for example, boron (B) or boron difluoride ($BF_2$) ions are implanted perpendicularly to the surface of the single-crystal-silicon-layer segment 13a by a predetermined implantation energy Eg so that the dopant concentration of the silicon-layer segment 13a is a predetermined value, for example, 1 to $2 \times 10^{17}/cm^3$. When the dopant concentration of the single-crystal-silicon-layer segment 13a reaches the predetermined value, the implantation of the dopant ions 18 is stopped and the resist 17 and the sacrificial oxide film 15 are removed as in a conventional process to form the nMOS in the single-crystal-silicon-layer segment 13a which is converted into the p-type semiconductor layer.

The implantation energy Eg of the dopant ions 18 is set so that the position of the maximum of the dopant concentration distribution lies at a position Pa corresponding to the bottom edges Ea and Eb which are covered by the thick insulating layer 16. Thus, in the concentration distribution profile Qa, the dopant concentration gradually decreases from the position Pa toward the upper and lower directions in the drawing.

When dopant ions 18, for example, boron or boron difluoride ions, are implanted into the single-crystal-silicon-layer segment 13a covered by the thick sacrificial oxide film 15 by such an implantation energy Eg, in the concentration distribution profile Qb in the central portion of the single-crystal-silicon-layer segment 13a covered by only the sacrificial oxide film 15, the dopant concentration reaches a maximum at a position Pb in the insulating layer 16 below the single-crystal-silicon-layer segment 13a and gradually decreases from the position Pb toward the upper and lower directions in the drawing.

In such a case, the implantation energy Eg for implanting the dopant ions 18 is determined in consideration of the thickness L of the single-crystal-silicon-layer segment 13a, the thickness D of the insulating layer 16 in the periphery of the silicon-layer segment, the constant C relating to the material constituting the single-crystal-silicon-layer segment 13a, the constant K relating to the material constituting the insulating layer 16, the implantation angle θ to the single-crystal-silicon-layer segment 13a, the data G relating to the dopant (for example, B ions or $BF_2$ ions), and the implantation condition M. The resulting implantation energy Eg maximizes the dopant concentration at the bottom edges Ea and Eb of the single-crystal-silicon-layer segment 13a.

When the dopant ions 18 are implanted into the single-crystal-silicon-layer segment 13a by such an implantation energy Eg, the dopant concentration in the bottom edges (peripheral region) Ea and Eb is increased compared to the concentration in other portions. As a result, no parasitic device is formed at the bottom edges Ea and Eb of the single-crystal-silicon-layer segment 13a.

According to the first embodiment, by one dopant ion implantation step, the single-crystal-silicon-layer segment 13a is activated and the dopant concentration in the bottom edges Ea and Eb of the single-crystal-silicon-layer segment 13a is maximized. Thus, the SOI-structured semiconductor device can be produced by simplified steps at reduced production costs compared to other methods including the modification of the gate electrode.

This embodiment describes the implantation of the dopant ions 18 by the implantation energy Eg which is set so that the position of the maximum of the dopant concentration distribution lies at a position corresponding to the bottom edges Ea and Eb of the single-crystal-silicon-layer segment 13a. In addition, the position of the maximum of the dopant concentration distribution may lie in the vicinity of the bottom edges Ea and Eb, for example, at a position Pa which is slightly or moderately distant from the surface of the insulating layer 16.

Figure 2:
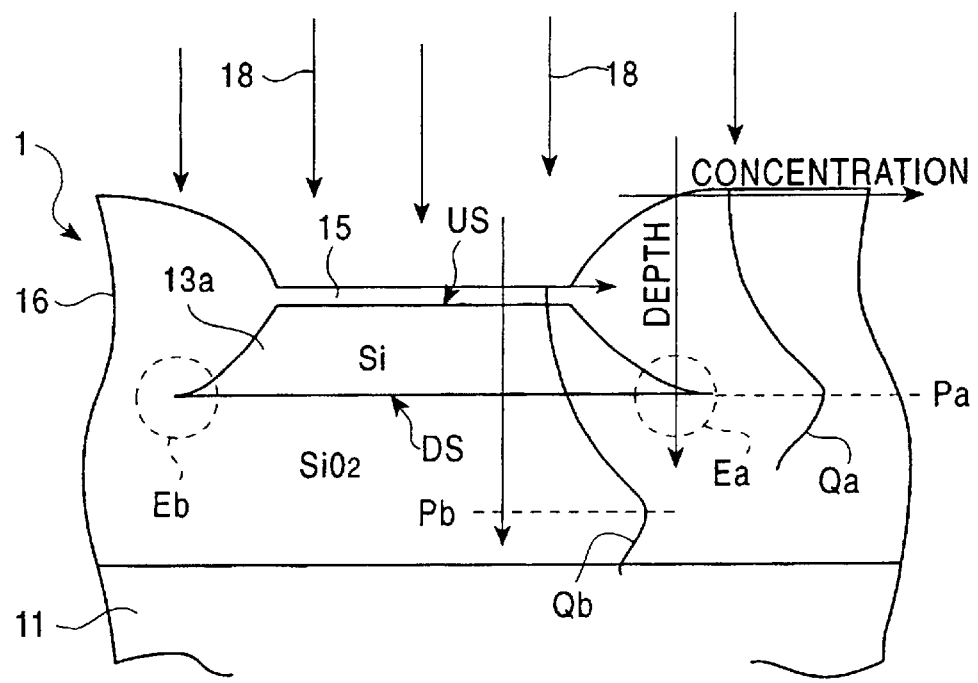
FIG. 2 shows the relationship between the structure of the semiconductor layer and the position (depth) in a SOI substrate, and between the structure of the semiconductor layer and the dopant concentration, in the implantation step of the first embodiment.
Figure 3:
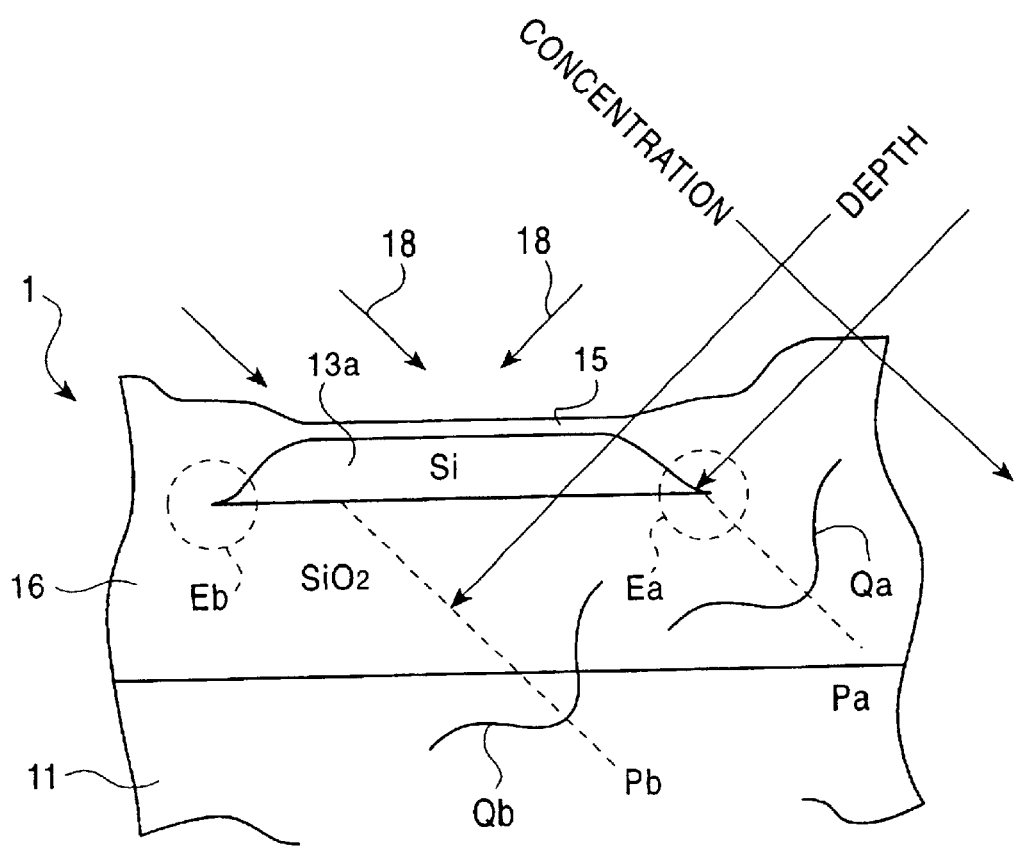
FIG. 3 shows the relationship between the structure of the semiconductor layer and the position (depth) in a SOI substrate, and between the structure of the semiconductor layer and the dopant concentration, in the implantation step of a second embodiment.

FIG. 3 shows the implantation step of a second embodiment and corresponds to FIG. 2 for the first embodiment. In FIG. 3, the dopant concentration is depicted along an oblique abscissa from the upper left to the lower right and the position (depth) in the SOI substrate 1 is depicted along an oblique ordinate from the upper right to the lower left. The implantation step is also enlarged in FIG. 3.

In the implantation step shown in FIG. 3, the SOI substrate 1 is rotated in the plane thereof, while dopant ions 18 of, for example, boron or boron fluoride are implanted obliquely to the plane of the single-crystal-silicon-layer segment 13a. The formation of the isolated single-crystal-silicon-layer segments 13a and the formation of the resist are substantially the same as those in the first embodiment. The implantation of the dopant ions 18 is performed by an implantation energy Eg which is set so that the dopant concentration is maximized at the bottom edges Ea and Eb of the single-crystal-silicon-layer segment 13a. When the dopant ions 18 of, for example, boron or boron fluoride are obliquely implanted by such an implantation energy Eg, the dopant concentration gradually decreases from the position Pa corresponding to the bottom edges Ea and Eb toward the orthogonal upper and lower directions in the drawing in the dopant concentration distribution profile Qa.

When the dopant ions 18, for example, boron or boron difluoride ions are implanted by such an implantation energy Eg from a portion of the single-crystal-silicon-layer segment 13a which is covered only by the sacrificial oxide film 15, the following dopant concentration distribution profile Qb is obtained in the central portion of the single-crystal-silicon-layer segment 13a. That is, the dopant concentration is maximized at a position Pb in the insulating layer 16 below the single-crystal-silicon-layer segment 13a and gradually decreases from the position Pb toward the orthogonal upper and lower directions in the drawing. The abscissa indicating the depth direction and the ordinate indicating the concentration are line segments parallel to (or orthogonal to) the implantation directions of the dopant ions 18.

Since the dopant ions 18 are obliquely implanted into the single-crystal-silicon-layer segment 13a in the second embodiment, the implantation energy Eg is determined in consideration of the implantation angle θ to the single-crystal-silicon-layer segment 13a as an important factor, in addition to the thickness L of the single-crystal-silicon-layer segment 13*a*, the thickness D of the insulating layer 16 in the periphery of the silicon-layer segment, the constant C relating to the material constituting the single-crystal-silicon-layer segment 13*a*, the constant K relating to the material constituting the insulating layer 16, the data G relating to the dopant (for example, B ions or $BF_2$ ions), and the implantation condition M.

According to the method of the second embodiment, the dopant concentration in the bottom edges Ea and Eb of the single-crystal-silicon-layer segment 13*a* is increased compared to other portions and the formation of the parasitic device is prevented. Thus, in the second embodiment, by one dopant ion implantation step, the single-crystal-silicon-layer segment 13*a* is activated and the dopant concentration in the bottom edges of the single-crystal-silicon-layer segment 13*a* is increased compared to other portions. Thus, the semiconductor device can be produced by simplified steps compared to other methods including the modification of the gate electrode.

In the second embodiment, the position of the maximum of the dopant concentration distribution may be in the vicinity of the bottom edges Ea and Eb.

According to methods for making the semiconductor device of certain embodiments of the present invention, in the implantation step for activating the silicon layer, an dopant is implanted with an implantation energy which is set so that the position of the maximum of the dopant concentration distribution lies at a bottom edge (peripheral portion) of the silicon-layer segment delimited by the delimiting region. Thus, the dopant concentration at the peripheral portion of the delimited silicon-layer segment is increased compared to the concentration in other portions of the silicon-layer segment, preventing the formation of the parasitic device. That is, by only one dopant implantation step, the silicon layer is activated and the dopant concentration at the peripheral portion of the silicon-layer segment is increased compared to other portions. Thus, an inexpensive semiconductor device is provided by simplified steps.

While the description above refers to particular embodiments of the present invention, it will be understood that many modifications may be made without departing from the spirit thereof.

What is claimed:

1. A method for making an SOI-structured semiconductor device, comprising:

forming a single-crystal silicon layer on an insulating layer;

forming a protective layer on the single-crystal silicon layer;

oxidizing part of the single-crystal silicon layer to delimit the single-crystal layer into a plurality of delimit silicon layer segments, wherein the oxidation propagates to a position under the protective layer to form a bird's beak structure while the delimited silicon layer segments include a wedge shaped region in contact with the bird's beak structure; and implanting a dopant into the delimited silicon layer segments, the dopant having a dopant concentration distribution in the delimited silicon layer segments after implantation, wherein the implanting comprises implanting the dopant with an implantation energy so that a maximum of the dopant concentration distribution lies within the wedge-shaped region of each of the delimited silicon layer segments.

2. A method for making a semiconductor device according to claim 1, wherein, in the implanting, the dopant is implanted with an implantation energy which is set so that the maximum of the dopant concentration distribution lies at the peripheral edge of the wedge shaped region of the delimited silicon layer segments.

3. A method for making a semiconductor device according to claim 1, wherein, in the implanting, the dopant is implanted perpendicularly with an respect to an upper surface of the delimited silicon layer segments.

4. A method for making a semiconductor device according to claim 1, wherein, in the implantation step, the dopant is implanted obliquely with respect to an upper surface of the delimited silicon layer segments.

* * * * *